United States Patent [19]
Rao

[11] Patent Number: 5,890,195
[45] Date of Patent: Mar. 30, 1999

[54] DRAM WITH INTEGRAL SRAM COMPRISING A PLURALITY OF SETS OF ADDRESS LATCHES EACH ASSOCIATED WITH ONE OF A PLURALITY OF SRAM

[75] Inventor: G.R. Mohan Rao, Dallas, Tex.

[73] Assignee: Silicon Aquarius, Inc., Richardson, Tex.

[21] Appl. No.: 855,944

[22] Filed: May 14, 1997

Related U.S. Application Data

[63] Continuation-in-part of Ser. No. 816,663, Mar. 13, 1997.

[51] Int. Cl.$^6$ ................................................. G06F 12/08
[52] U.S. Cl. .............................. 711/105; 711/104; 711/5; 711/117; 711/118
[58] Field of Search ............................... 711/5, 104, 105, 711/118, 117, 170; 395/833

[56] References Cited

U.S. PATENT DOCUMENTS

| | | | |
|---|---|---|---|
| 4,384,342 | 5/1983 | Imura et al. ................................. | 711/5 |
| 5,226,009 | 7/1993 | Arimoto ............................. | 365/189.04 |
| 5,577,223 | 11/1996 | Tanoi et al. ............................. | 711/118 |
| 5,588,130 | 12/1996 | Fujishima et al. ....................... | 711/118 |
| 5,603,009 | 2/1997 | Konishi et al. .......................... | 711/104 |
| 5,680,570 | 10/1997 | Rantala et al. ........................... | 711/113 |
| 5,761,694 | 6/1998 | Rao ............................................. | 711/5 |
| 5,787,457 | 7/1998 | Miller et al. ............................. | 711/105 |
| 5,835,932 | 11/1998 | Rao ............................................ | 711/5 |

OTHER PUBLICATIONS

Ramtron, "Specialty Memory Products ", DM2223/2233 Sync Bursting EDRAM 512kbx8 Enhanced Dynamic RAM pp. 2–57 to 2–62 (Oct. 1994).

Primary Examiner—John W. Cabeca
Assistant Examiner—Felix B. Lee
Attorney, Agent, or Firm—James J. Murphy; Winstead Sechrest & Minick

[57] ABSTRACT

A memory 601 comprising a plurality of static random access cell arrays 701, and a plurality of sets of latches 703 each for storing address bits associated with data stored in a corresponding one of the static random access cell arrays 701. Bit comparison circuitry 503 compares a received address bit with an address bit stored in each of the plurality of sets of latches 703 and enables access to a selected one of the static random cell arrays 701 corresponding to the set of latches 703 storing an address bit matching the received bit.

27 Claims, 8 Drawing Sheets

DRAM WITH INTEGRAL SRAM COMPRISING A PLURALITY OF SETS OF ADDRESS LATCHES EACH ASSOCIATED WITH ONE OF A PLURALITY OF SRAM

CROSS-REFERENCE TO RELATED APPLICATION

This application for patent is a continuation-in-part of DRAM WITH INTEGRAL SRAM AND SYSTEMS AND METHODS USING THE SAME, U.S. patent application Ser. No. 08/816,663 (Attorney Docket No. 17200-P001US), filed on Mar. 13, 1997.

TECHNICAL FIELD OF THE INVENTION

The present invention relates in general to electronic memories and in particular to a dynamic random access memory (DRAM) with integral static random access memory (SRAM), and systems and methods using the same.

BACKGROUND OF THE INVENTION

Currently available dynamic random access memories (DRAMs) are generally based upon architectures which share the following characteristics. First, the typical general purpose DRAM has a single data port for writing and reading data to and from addressed storage locations ("dual ported" DRAMs are available which provide two data ports, typically one random and one serial port, however, these devices are normally limited to special memory applications). Second, data writes and reads are only made on a location by location basis, with each location typically being one bit, one byte or one word wide. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PCs) generally share a number of common features. For example, the vast majority of today's PCs are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, and in particular in a multiprocessing PC environment.

A CPU typically exchanges data with memory in terms of "cache lines." Cache lines are a unit of data by which operandi and results can be stored or retrieved from memory and operated on by the CPU in a coherent fashion. Cache lines accesses are made both to cache and to system memory.

In systems operating with CPUs having a 32-bit data I/O port, a cache line is normally eight (8) 32-bit words or 256 bits. In the foreseeable future, data I/O ports will be 64 bits wide, and cache lines may be comprised of 16 64-bit data words or 1024 bits in length. Typically, the CPU may read a cache line from a corresponding location in memory, perform an arithmetic or logic operation on that data and then write the result back to the same location in system or cache memory. A given location for a cache line can be in one or more physical rows in memory and therefore an access to cache line location may require multiple /RAS cycles. In any event, the CPU, depending on the operating system running, can generally access any location in memory for storing and retrieving operandi and results.

Often situations arise when the results from a given operation exceed the length of the cache line and therefore data can no longer be processed as coherent cache line units. For example, if the CPU performs a n by n bit integer multiplication, the result could be a maximum of 2n bits. In other words, while each operand can be retrieved from memory as a cache line, the result exceeds the length of a single cache line and coherency is lost. Similarly, when operandi containing decimal points or fractions are involved, exceeding the length of a cache line can also take place. In the case of fractions, long strings of bits, which exceed cache line length, may be required to minimize rounding errors and therefor increase the precision of the calculations.

In any computing system, and in particular multiprocessing systems, the ability to operate on data as cache lines substantially improves operating efficiency. Thus, when a cache line is exceeded during an operation, system performance is reduced. Specifically, when a cache line is exceeded, the CPU must either access that data as two cache lines or as a cache line and additional discrete words or doublewords of data. As a result, extra memory cycles are required to execute an operation and the transfer of data within the system is more difficult because the necessary data is no longer in proper cache line data structures.

Thus, the need has arisen for new memory and system architectures in which operations can be performed on coherent units of data, even if cache lengths are exceeded.

SUMMARY OF THE INVENTION

A memory is disclosed comprising a plurality of static random access memory cell arrays and their plurality of sets of latches, each for storing address bits associated with data stored in a corresponding one of the static random access cell arrays. Bit comparison circuitry compares a received address bit with an address bit stored in each of the plurality of sets of latches and enabling access to a selected one of the static cell arrays corresponding to the set of latches storing an address bit matching the received bits.

A method is provided for accessing blocks of data in a memory having a plurality of registers and a memory array. An address is received through an address port and paired with addresses previously stored in each of a plurality of latches. When a match occurs between the received address and a matching address stored in one of the latches, a register corresponding to the latches storing the matching address is accessed through a data port. When a match does not occur between the received address and an address stored in one of the latches, the following substeps are performed: data is exchanged between a location in the memory array addressed by the received address and a selected one of the registers; and storing the received address in one of the latches corresponding to the selected register. The received address is modified to generate a modified address. Data is then exchanged between a location in the memory array addressed by the modified address and a second selected one of the registers while the modified address is stored in the latches corresponding to the second selected register.

A memory is also disclosed comprising a plurality of banks, including first and second arrays of static random access memory cells, first and second latches, address compare circuitry and a row address latch. The first latch is provided for storing a plurality of address bits accessing associated data stored in the first array of static cells. The second latch is provided for storing a plurality of address bits accessing associated data stored in the second array of static cells. Address comparison circuitry is provided for comparing first selected bits of a received address with address bits stored in the first and second latches and selectively enabling access to the first and second arrays in response. A row address latch stores a received address and increment and decrement circuitry allows for selective modification of an address stored in the address latch. A global row assignor is provided for selecting a bank for access in response to second selected bits of the received address.

A method is also disclosed for operating a memory having a plurality of banks, each bank including a dynamic random access memory cell array and first and second static random access memory cell arrays. A row address is received and a bit decoded to select a first bank for access. Selected bits of the received row address are compared with bits stored in first and second latches in the first bank, the first latch holding an address associated with data stored in the first static array and the second latch holding an address associated with data stored in the second static array of the first bank. When a match occurs between the selected bits of the received row address and the bits stored in the first latch, these subsets are performed: the first static array of the first bank is accessed; the received row address is modified to generate a second row address; and a second bank loads a selected one of the first and second static arrays with data from the dynamic array using the second row address. When a match does not occur between the selected bits of the received row address and the bits stored in the first and second latches of the first bank, these substeps are performed: in the first bank, loading a selected one of the first and second static arrays with data from the dynamic array using the received row address; the received row address is modified to generate a second row address; and, in the second bank, selected one of the first and second static arrays is loaded with data from the dynamic array using the second row address.

Among the many advantages, the principles of the present invention allow for the efficient accessing of blocks of data as required by the CPU and/or the operating system. For example, in a four bank embodiment, with two registers per bank, a contiguous block of eight rows of data and associated addresses can be stored in register for fast access. Typically, the CPU accesses data within such spatial or temporal blocks. Thus, when the CPU requires data from memory, and that data is already stored in register, data with a given spatial or temporal locality is also most likely already in a register. In this fashion, the number of "hits" to pre-stored data is substantially increased. The principles of the present invention also allow for high speed accesses directly from the registers, in addition to traditional accesses to the DRAM cell array.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–9 of the drawings, in which like numbers designate like parts.

Figure 1A:
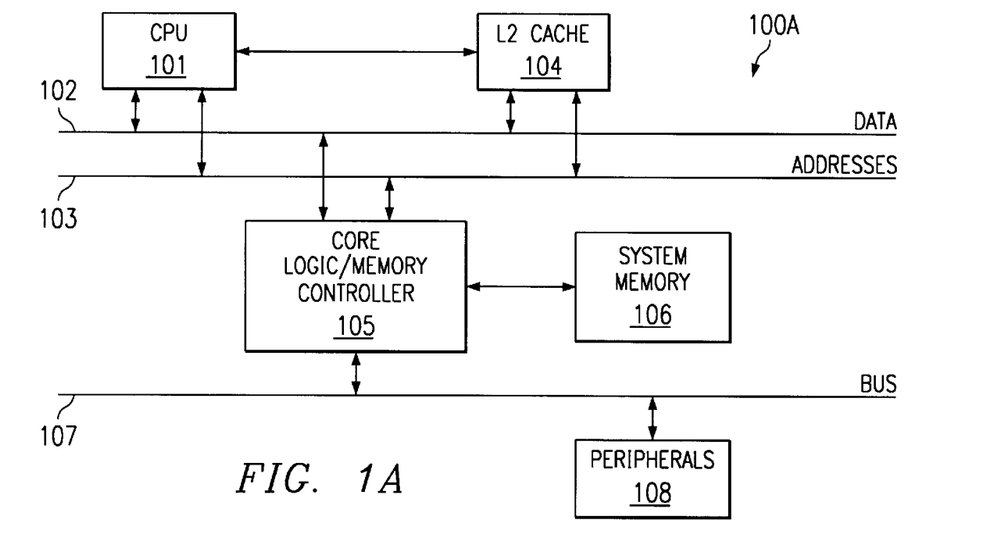
FIGS. 1A and 1B are block diagrams respectively depicting two basic system architectures typical of those found in personal computers (PCs)
Figure 1B:
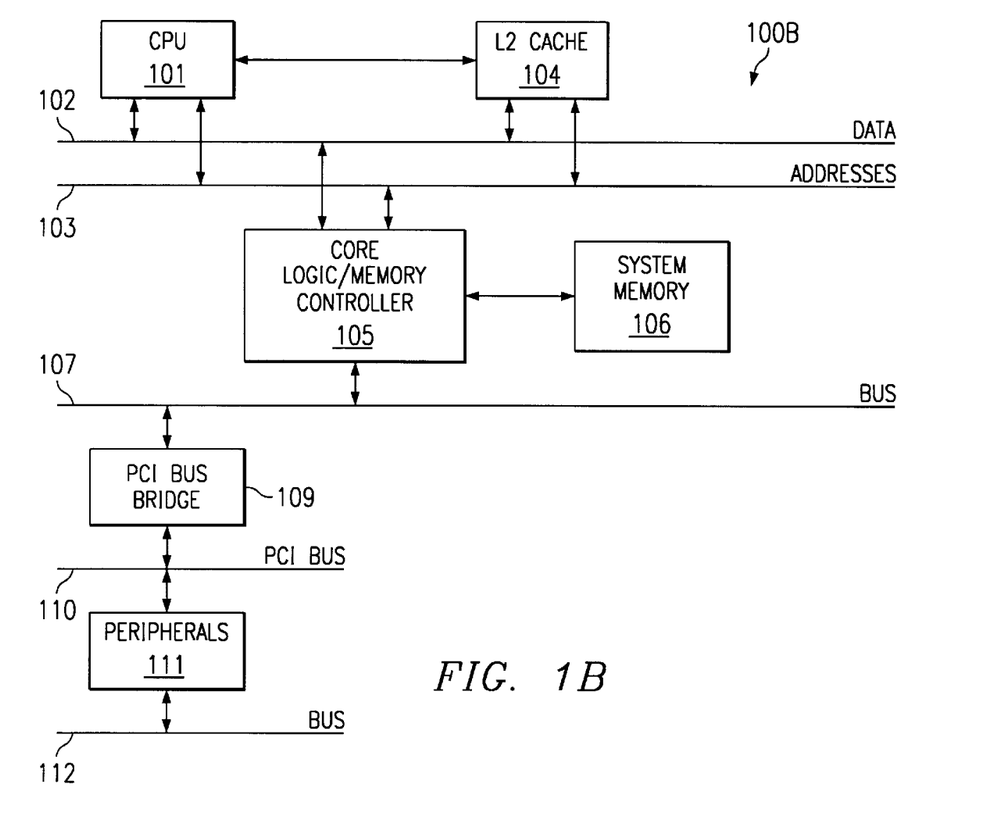

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be, for example, a complex instruction set computer (CISC), such as an Intel Pentium™ class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be, for example, a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as /RAS, /CAS, /WE (write enable), /OE (output enable) and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory, including the cache tags, sets associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be, for example, a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Figure 2A:
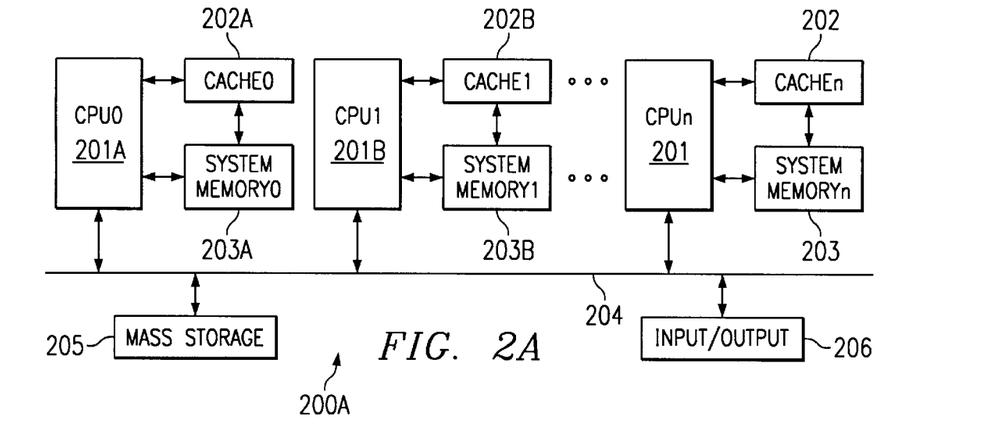
FIG. 2A depicts a multiprocessing system in which each processor operates in conjunction with private system memory.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common (public) memory and all data sharing between processors occurs over communications links. NORMA typically is used in fully distributed systems.

Figure 2B:
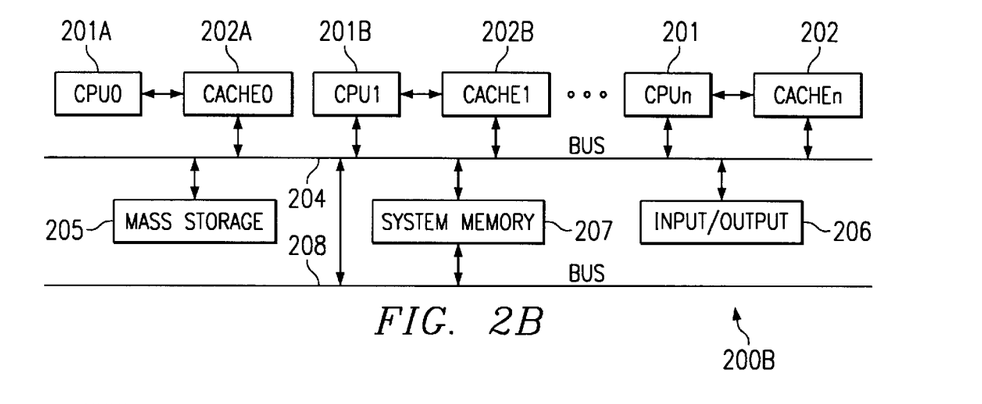
FIG. 2B depicts a multiprocessing system in which each processor operates in conjunction with a public system memory.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a uniform memory access (UMA) architecture. Under the UMA paradigm, all processors have equal access to system memory and all processors have local cache. The uniform memory access architecture typically provides the fastest possible interaction between processors and is the common architecture used in PCs, work stations, and other desktop computing devices. UMA based systems are often referred to as "symmetric-multiprocessing" systems.

Figure 2C:
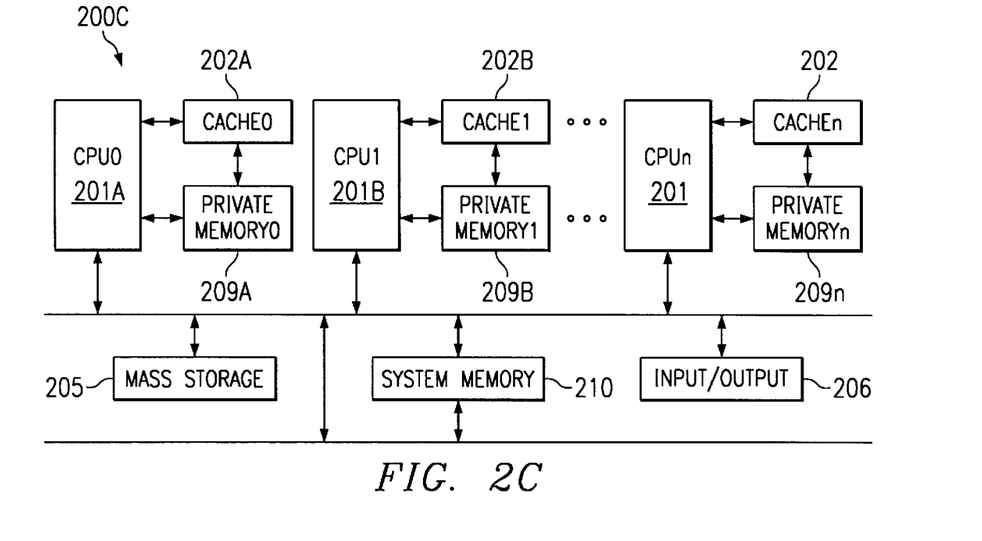
FIG. 2C depicts a multiprocessing system in which each processor operates in conjunction with both private memory and public system memory.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

At the highest system level, there are a number of ways to implement the hardware architectures shown in FIGS. 2A, 2B and 2C in a complete hardware/software system. Three such systems are shown in FIGS. 3A–3C, respectively.

Figure 3A:
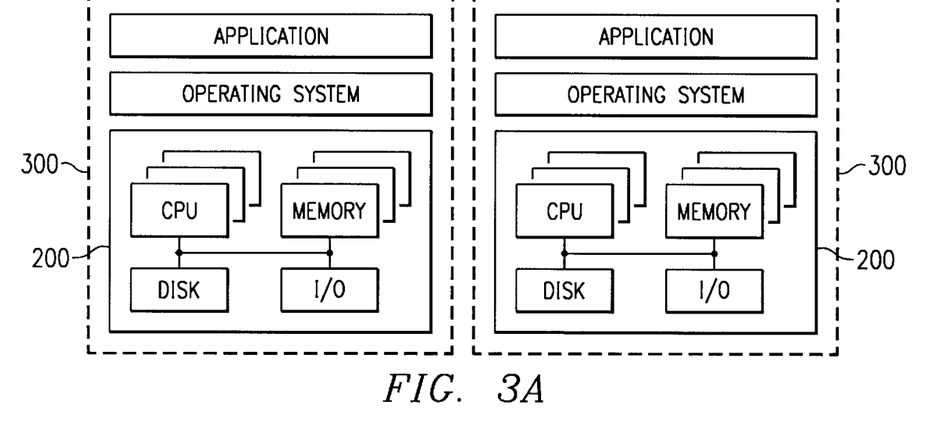
FIG. 3A is a diagram illustrating a "loosely coupled" multiprocessing architecture in which each processing node maintains a dedicated copy of the operating system and a dedicated copy of the applications program.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
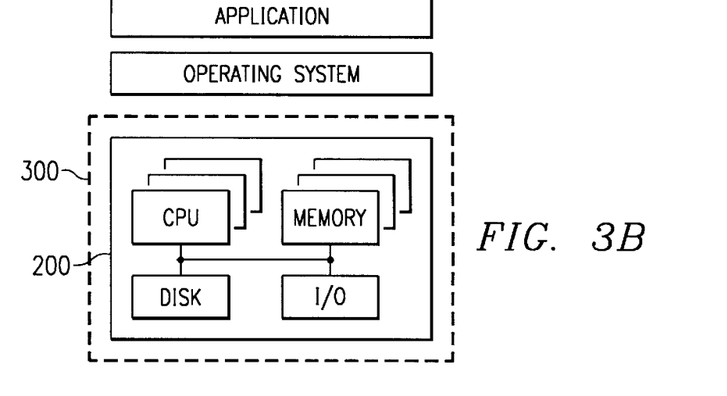
FIG. 3B depicts a "tightly coupled" multiprocessing system in which all processing nodes share a single copy of the operating system and a single copy of the applications program.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
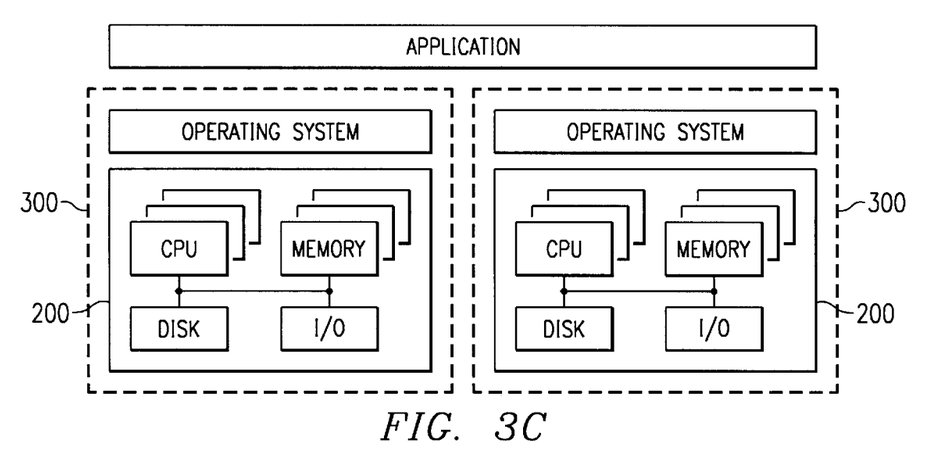
FIG. 3C depicts a diagram of a "snugly coupled" multiprocessing system in which each processing node maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
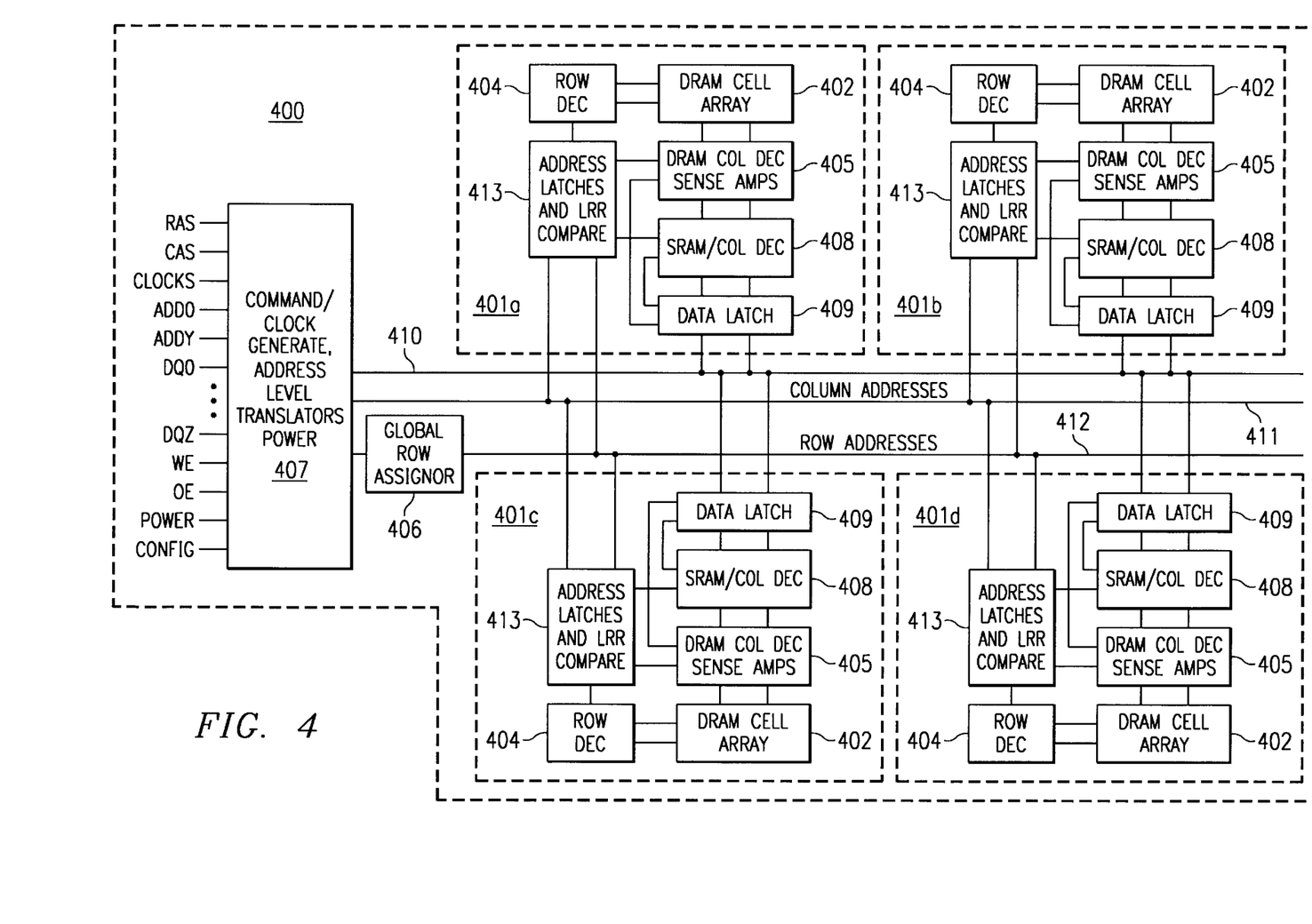
FIG. 4 illustrates a functional block diagram of a dynamic random access memory device according to one embodiment of the principles of the present invention.

FIG. 4 is a functional block diagram of a dynamic random access memory device 400 according to one embodiment of the principles of the present invention. Memory 400 includes N number of memory banks or units 401, with four such banks 401a, 401b, 401c, and 401d being shown in FIG. 4 for discussion; the actual number of banks will vary from application to application, although N is preferably an even number two or greater. Banks 401 communicate with external circuitry through control and configuration circuitry 407, discussed further below. In single CPU processing systems, such as systems 100a and 100b, memory subsystem 400 may be used to construct system memory 102, although many other applications in the single CPU personal computer environment are possible, such as in the display frame buffer. In multiprocessing architectures, such as systems 200a, 200b, and 200c, memory subsystem 400 can be used to construct either the system memories or the local (private) memories. Preferably, subsystem 400 is a monolithic integrated circuit device.

Each bank 401 includes an array 402 of dynamic random access memory (DRAM) cells arranged in N number rows and M number columns. As is known to those skilled in the art, each array 402 may be partitioned into multiple subarrays, with the columns organized using either an open-bitline or folded-bitline approach. Each bank 401 further includes a traditional DRAM row decoder 404 coupled to the array wordlines, and traditional DRAM sense amplifiers/column decoder circuitry 405 coupled to the array bitlines. The row and column decoders are preferably organized in hierarchical fashion in which a main decoder and one or more levels of subdecoders/drivers are used. Generally, each row decoder 404, in response to a row address, selects one of N rows for access during an active cycle when the row address strobe /RAS is in a logic low state. Column decoder selects P number of pages (locations) of C number of columns (bits) from the M total number of columns in response to P number of column addresses for access during an active cycle.

Global row assignor 406 performs a "coarse granularity decoding" using L number of least significant row address bits from each received row address. Specifically, all banks 401 are active during each /RAS cycle, and global row assignor using the L least significant row address bits to select. Row decoders 404 consequently decode the Y-L number of remaining most significant address bits to simultaneously select one row per /RAS cycle in each DRAM array during a DRAM access.

Control circuitry 407 receives conventional DRAM control signals and clocks from an external source, such as processor 101 or core logic 105 in system 100 or CPUs 201 in multiprocessing systems 200A–200C. These signals include a synchronous clock (SCLK), a row address strobe (/RAS), a column address strobe (/CAS), read/write select (RAN) and output enable (/OE), along with data (DQ) and addresses ($A_{dd}$). Control circuitry 407 also inputs a configuration bit (CONFIG), discussed below. In the preferred embodiment, the address input port is multiplexed in a conventional manner wherein row addresses and column addresses are received sequentially at the same pins and latched in with /RAS and /CAS respectively.

According to the principles of the present invention, each bank 401 further includes static random access memory (SRAM)/SRAM column decoder circuitry 408. SRAM circuitry 408 will be discussed in further detail in conjunction with FIG. 6, but can generally be described at this point as follows. First, a linear array of M number of SRAM cells is included for storing a row of data transferred from the corresponding DRAM array 402. Second, SRAM column decoder circuitry is included for page access (reads or writes) of C-bit wide pages of data to the row of data in SRAM array in response to one or more column addresses.

Data latches 409 interface the DRAM sense amplifiers/column decoders 405 and the SRAM column decoders 408 with a data bus 410. Column addresses are transferred via a column address bus 411 and row addresses by a row address bus 412.

Address latches and last row read (LRR) compare circuitry 413 includes latches for storing the current row and column addresses received at the address port $A_{dd}0$–$A_{dd}Y$. Also included as part of circuitry 413 are latches for storing the high order (MSB) row address bits of the last row read (LRR) and comparison circuitry for comparing the stored LRR bits to the high order bits (MSB) of the current row address.

It should be noted that while in the illustrated embodiment the least significant row address bits are processed by global assignor 406 and the most significant row address bits are used internal to the banks 401 to select individual rows of cells, other arrangements will just as easily apply. For example, a given number of most significant row address bits could be used by global row assignor 406 and the remaining least significant bits used for individual row select. Further, either big- or little-endian data structures can be used. The number of address bits presented to the SRAM cache of a given bank 408 is identical to the number of MSB address bits presented to DRAM row decoder 404.

Figure 5:
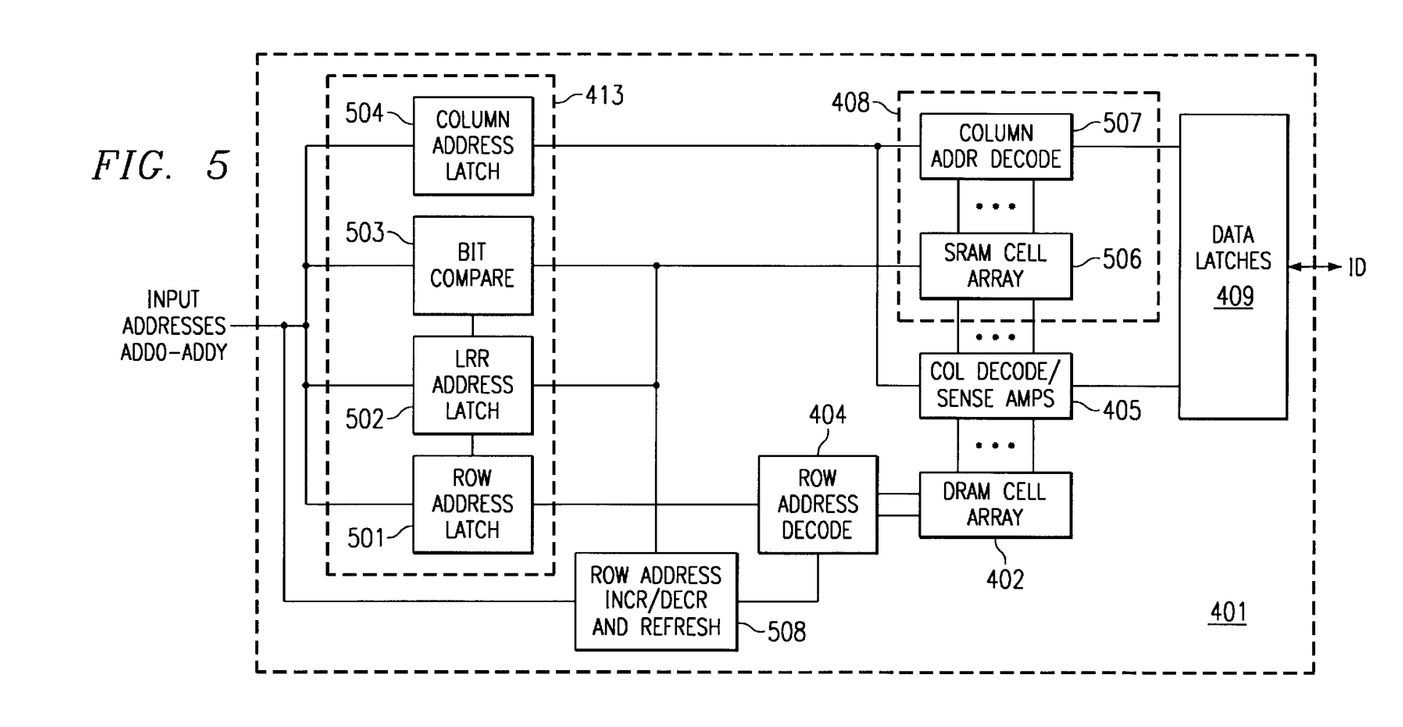
FIG. 5 depicts a more detailed diagram emphasizing the data and address routing circuitry of the memory shown in FIG. 4.

FIG. 5 is a more detailed diagram emphasizing the data and address routing circuitry of a selected bank 401. Addresses are received in a multiplexed fashion at the address port AddO–AddY. The row address bits are latched on the falling edge of /RAS (which follows the SCLK) into row address latch 501. The most significant bits are presented to the fine granularity row decoders 404 and the least significant bits to the global row assignor 406. The most significant row address bits from the previous (last) /RAS cycle are transferred to last row read address latch 502. Comparison circuitry 503 compares the most significant row address bits latched into row address latch 501 and the last read row address held in latch 502. During each /CAS cycle, one or more column addresses are received at address port AddO–AddY and latched into column address latch 504 with each falling edge of /CAS.

SRAM registers 506 store data associated with the address bits stored last read address latch 502 (i.e., assuming that row addresses and data are considered together as a data structure, the row address MSBs comprise the row field and the data bits, the data field). A second column decoder 507 is provided to access locations in SRAM registers 506. Row address increment/decrement and refresh control circuitry 508, when enabled, steps through the rows of array 402 to perform cell refresh through the DRAM sense amps and implements the address transformations detailed below.

Preferred methods of operating memory 400 can now be described. During an access, a row address is first received at address pins AddO–AddY. On the falling edge of /RAS, the least significant row address bits (in the four bank embodiment, the two least significant bits) are passed to global row assignor 406 and the remaining most significant bits are latched into row address latch 501 of each bank 401. The most significant bits stored in each row address latch 501 from the previous /RAS cycle are transferred into the corresponding LRR address latch 502.

In a first method of reading, the bit CONFIG at the input to memory 400 is set to a logic low. Global row assignor 406 determines from the current least significant row address bits the bank 401 which corresponds to the address space of the received address. The comparator 503 of the corresponding bank 401 is enabled such that during the period between the falling edge of /RAS and the first high to low transition of /CAS, that comparator 503 compares the current address most significant bits in the corresponding row address latch 501 and bits stored in LRR address latch 502. If a match occurs for the given bank, the SRAM column address decoders 507 are selected and set-up to access the complete SRAM cell array 506 of that bank. Column addresses received at the address port AddO–AddY are latched into column address latches 504 of each bank and each SRAM column decoder 507 accordingly allows access to a C-bit word per each of P number of column addresses latched-in with /CAS. The accesses are implemented through a C-bit wide data bus 410; if for example, each bank is organized as a by 16 device, data bus 410 is 16-bits wide and so on. Preferably, the selected (enabled) bank is the only bank 401 accessed via data bus 410, the word of data in the data latches 409 of the other banks is simply not used.

If the address bits in latches 501 and 502 do not match for the bank 401 addressed by the received row address LSBs, access must be made to the corresponding DRAM array. Specifically, for a read to the addressed bank 401, the row is selected by DRAM row decoder 404 from the corresponding DRAM array 402 and an entire row of data transferred to the associated SRAM array 506 for output when the column addresses are presented. For the remaining banks 401, the MSBs are incremented or decremented using the corresponding row address increment circuitry 508. A row of data for these banks is similarly transferred to the corresponding SRAM arrays 507.

Assume for example, in the illustrated four bank system, that the received row address has LSBs 01 indicating the address space of bank 401b (Bank1) is to be accessed. Global row assignor 406 hence enables Bank1 to make the comparison of the row current address MSBs and the bits stored in the Bank1 LRR latch. The row address MSBs as received are not modified for transferring data from the bank 401b DRAM array 402 to the Bank1 SRAM array. However, for bank 401a (Bank0) the row address MSBs are decremented by 01 by the corresponding row increment circuitry 508 and the row address MSBs for banks 401c (Bank2) and 401d (Bank3) are incremented by 01 and 10 respectively. In other words, if the address to Bank1 (the received row address MSBs) is designated address A+1, then address A+1 is decremented by one such that Bank0 receives address A0 and incremented such that Bank2 receives address A+2 and Bank3 receives address A+3. These addresses are used to access the associated bank's DRAM array 402 and the accessed data in DRAM transferred to the SRAM arrays. The new addresses are stored in address latches 501.

During accessing of the addressed bank, assuming again for discussion purposes BANK1, the DRAM of any bank, including in this case the DRAM array 402 of Bank1 can be refreshed. The DRAM column decoders 405 isolate the corresponding DRAM arrays 402 from the SRAM arrays 408. Thus, while data is being accessed from the SRAM array of the selected bank 401, any or all of the DRAM arrays 402 can be refreshed without disturbing the data in the SRAM arrays. Refresh is preferably performed by incrementing the row addresses in each bank using increment and refresh circuitry 508 and latching each row of data using the DRAM sense amplifiers 405 in a conventional fashion.

In the preferred embodiment, once the data in the SRAM array 506 of the addressed (selected) bank has been accessed, the /RAS cycle is complete. The data in the SRAM arrays 506 of the remaining banks 401 is available through the associated data latches 409, and could be used, but typically is reserved for future /RAS cycles. The current row address MSBs for the selected banks and the new row address MSBs are transferred to the LRR registers during the next /RAS cycle. The corresponding data remain in the SRAM arrays. Advantageously, since the CPU and/or operating system typically accesses data within temporally or spatially adjacent areas in memory, the probability is substantial that a match will occur.

For a write operation the following is the preferred method. An address is received at address port AddO–AddY. From the LSBs, global row assignor 406 determines the bank 401 assigned to the corresponding row address space. Assume again for example, the LSBs are 01, addressing bank 401b (Bank1). The received row MSBs are taken as the address to the Bank1 DRAM array 402. As was done above, the row address increment circuitry 508 for Bank0 decrements the received row MSBs to obtain a row address to the Bank0 DRAM array and increments the received MSBs by 01 and 10 to obtain row addresses to the DRAM arrays of Bank2 and Bank3 respectively. The MSB row address bits for each bank 401 is written into the respective bank's LRR register 502.

In a second method of accessing, the CONFIG bit at the input to memory 400 is set high. In this case, during an access, the MSBs of a received address are compared by all the comparators 503. If a match occurs in any one or more banks 401, the data from all the banks is taken, although the data from the non-matching banks may be discarded or left in the data latches.

Figure 6:
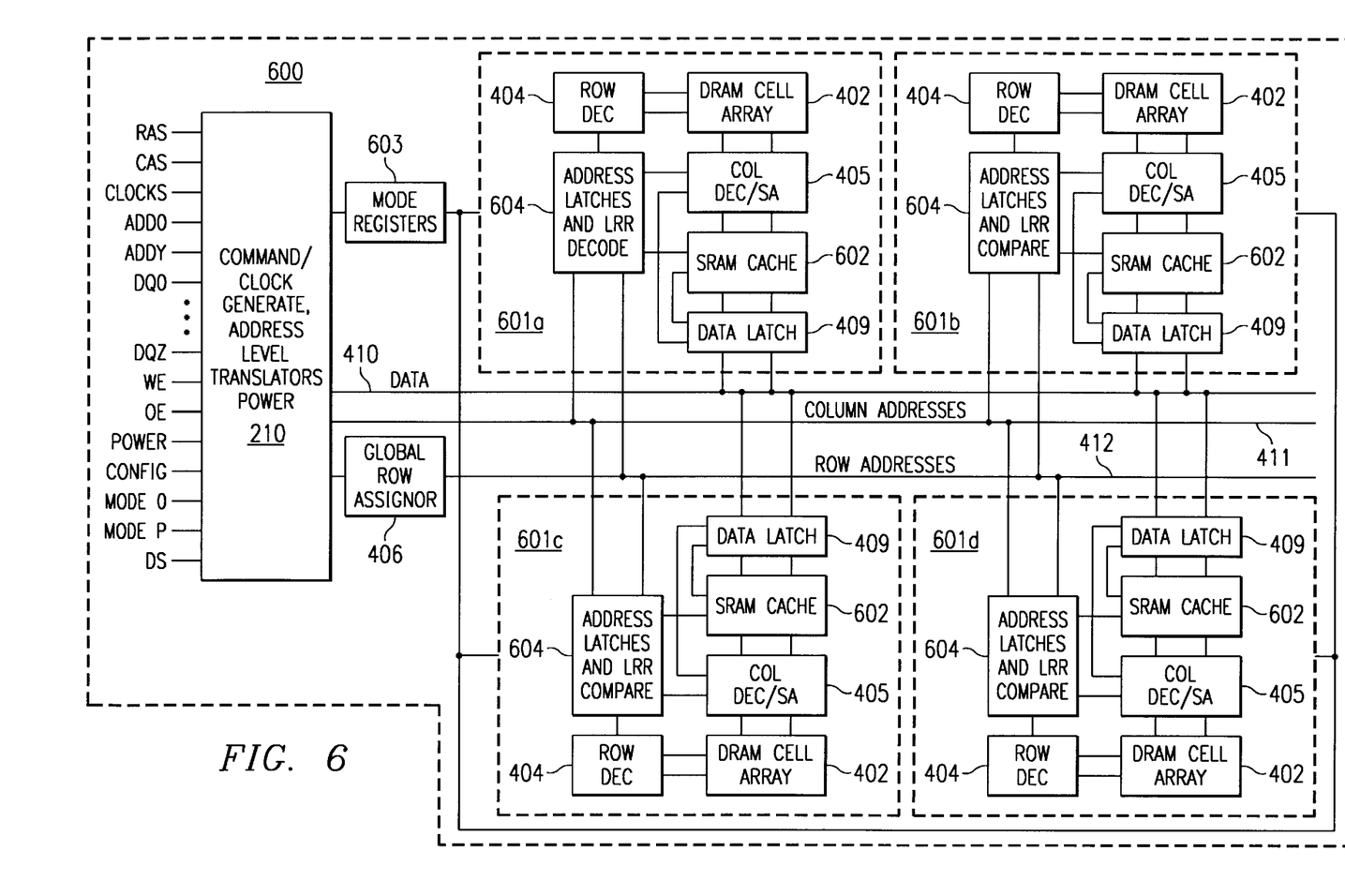
FIG. 6 depicts a second dynamic random access memory device according to the principles of the present invention.

FIG. 6 depicts a second Dynamic Random Access Memory (DRAM) device 600 according to the principles of the present invention. In embodiment 600, as shown in FIG. 6, an SRAM cache unit 602 is included in each bank 601. SRAM cache units 602 will be described in detail in conjunction with FIG. 7; however, each SRAM cache 602 can be generally described as having a plurality of SRAM arrays (registers), each having a corresponding dedicated SRAM column decoder. DRAM 600 further includes a set of mode registers and input for receiving a global data strobe (DS). Address latches and LRR decode circuitry 604 are appropriately expanded to control the multiple SRAM embodiments, as will be demonstrated in FIG. 7. Mode register 603 and the functioning of the global data strobe (DS) will also be discussed further below.

Figure 7:
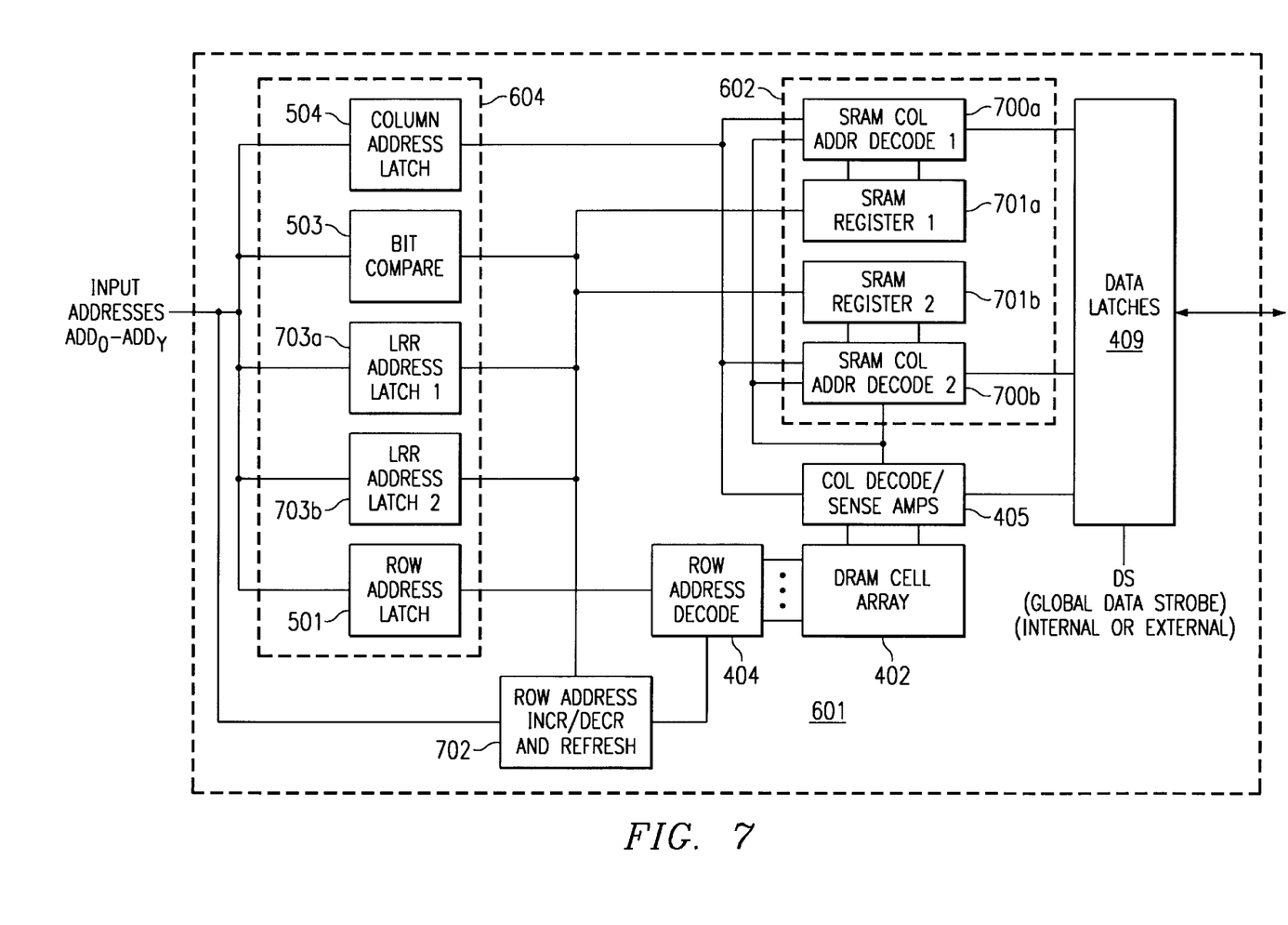
FIG. 7 depicts a selected SRAM cache depicted in FIG. 6.

As shown in FIG. 7, each SRAM cache 602 includes a plurality of SRAM column decoders 700 coupled to a corresponding SRAM register 701. In the illustrated embodiments, two SRAM registers 701a and 701b, associated with a pair of SRAM column decoders 700a and 700b shown for brevity and clarity. However, it should be recognized that an SRAM cache 602 may be constructed with additional SRAM registers 700 along with a corresponding number of SRAM decoders 701.

Additionally, a corresponding number of LRR latches 703 are provided to support the multiple SRAM registers 701. Hence, if in a given embodiment includes n number of registers 701, there will preferably also be n number of LRR registers 704, although this is not an absolute requirement. In the illustrated embodiment where two SRAM registers 701a and 701b are depicted, a corresponding pair of LRR latches 704a and 704b are also shown.

DRAM cell array 402, row address decoder 404, address latches/LRR comparison circuitry 413 and row address increment/decrement and refresh circuitry 702 all substantially operate as described above.

Assume that each DRAM cell array 402 is arranged in m number of rows and n number of columns. Row address decoder 404 will be coupled with the wordline controlling access to each row of cells. In the most straightforward embodiment, n number of sense amplifiers are provided with one sense amplifier coupled to bitline associated with each column of cells. DRAM column decoder/sense amplifiers 405 includes a data interface with SRAM column decoders 700 allowing data to be exchanged, between DRAM array 402 and SRAM registers 701, either individually or in combination. SRAM and DRAM column decoders 700 and 402 are all coupled to column address latch 504.

In the illustrated embodiment, where DRAM array 402 is n columns wide and each SRAM register 701 correspondingly is a linear array of n number of cells disposed in a single row. In the present example therefore, the cache width is n and the cache depth is two. Each row in either cache or DRAM memory stores p number of cache lines, wherein p equals m divided by b, the number of bits per cache line.

The multiple SRAM register/column decoder structure of each SRAM cache 602 has further advantages. For example, if SRAM column address decoders 700 are static devices, then while DRAM cell array 402 of any bank 601 is in precharge (i.e., /RAS high), one or more of the corresponding SRAM registers 701 can be accessed either in a random or page fashion. Of course, column address decoders 700 can be dynamic devices which are inactive during the period when /RAS is high thereby providing for substantial power savings across the banks 601 of device 600.

SRAM registers 701 of given bank 601 can be used in various combinations with the associated DRAM cell array 402 and its column decoder 405 to optimize data exchanges.

For example, one SRAM register 701 of the selected bank 601 can access data through the device data port (DQ), while simultaneously data can be exchanged between the associated DRAM cell array 402 and any of the remaining SRAM registers 701 in the same cache unit 602. At the same time, data exchanges can occur between the SRAM registers 701 and the associated DRAM cell array 402 of each of the other banks 601.

For any SRAM registers 701 in device 600 which are not being accessed through the device I/O port, a number of different data exchanges between the data cell array 402 and the SRAM registers 701 can be set up. Among other things, the contents of a SRAM register 701 can be copied to a row in the corresponding DRAM cell array 402 or vice versa; data can be copied from DRAM to a SRAM register. During accesses through the data port (DQ) each port can be individually configured such that reads and writes are made to the cache unit 602 only, to the DRAM cell array 402 only, or to both an SRAM register 701 in the cache 602 and to the DRAM array 402.

The multiple SRAM register embodiment 600 allows for the selective implementation of one of a number of addressing schemes. For example, assume that global row assignor 406 has taken the received least significant row address bits and has selected BANK 1 for access. Assuming a two SRAM register embodiment, the most significant row address bits are then compared with two addresses stored in the LRR address latch 502 (one corresponding to each row of data stored in a corresponding SRAM register 701). If a match occurs, then the SRAM register 701 corresponding to the matching addresses is accessed. In this case the probability of a match (cache hit) are increased since the number of SRAM registers in which the desired data could possibly be stored in has increased.

Alternatively, the multiple registers 701 of each bank 601 could be considered as residing in a single address space. In this case, the most significant bits of an incoming row address are compared against a single stored LRR address. If a match occurs, all of the SRAM registers of the given bank are then accessed in a predetermined sequence. Among other things, this scheme would allow paging of data in multiple page lengths, depending on the length of each row in SRAM and the number of SRAM registers accessed. Provisions can be made during the setup of Mode Registers 603 to accomplish varying embodiments.

In an additional alternative, data can be loaded from the DRAM arrays such that the data in a selected SRAM register in a given bank is associated with an address non-contiguous with the addresses associated with the contents of other registers in that bank. For example, row address increments/decrements 501 could be configured such that if Bank 0, SRAM register 701a is loaded with data corresponding to Addr0, the associated register 701b is loaded with data corresponding to Addr4. For bank 1 registers 701a and 701b are respectively loaded with data corresponding to Addr1 and Addr5. Similarly, the SRAM registers of Bank 2 hold data at addresses Addr2 and Addr6 and Bank 3 data at addresses Addr3 and Addr7. Numerous other combinations/permutations are possible.

Mode register 603, is "set" by the CPU (or corelogic, at CPU's command) to operationally configure memory device 600. These registers may be loaded either through the data port (DQ), the address port (ADD$_x$) or a dedicated mode register data port (MODE O-MODE P, FIG. 6). Preferably, either the data port or the address port is used for loading the mode register 603 since they are sufficiently wide and no additional pins to the device are required.

The conventional control signals /RAS, /CAS, /CS and /WE are used to control the loading of mode registers 603. There are many combinations of the states of these signals which can send device 603 into the Load Mode Registers state. For example, a chip select signal /CS (FIG. 6), /RAS, /CAS and /W could all be set to a logic low state. In response to this combination of input signals, each of the banks 601 would be deactivated. The mode control data can then be loaded into mode registers 603, preferably timed by the system clock.

Figure 8:
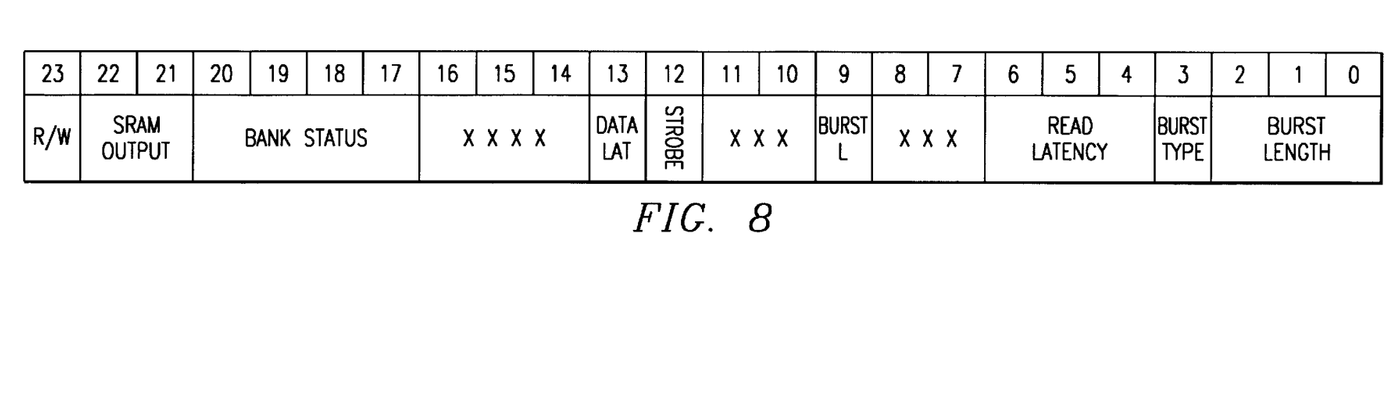
FIG. 8 is a diagram of the bitfields of the mode register shown in FIG. 6.

FIG. 8 is a diagram of the bitfields of mode registers 603. Each of these bitfields can be described as follows.

Bits 0–2 set the burst length for device 600. The burst length is the number of words clocked into or out of data latches 409 of the bank 601 being accessed.

Bit 3 defines the burst type. In the illustrated embodiment, if zero is written into the bit 3 position, the burst output will be serial and if a Logic One is written thereto, an interleaved burst will take place.

The bitfield comprised of bits 4–6 define the read latency. Typically, it takes (slightly) longer to perform a write than it does to perform a read. A read after write, or write after read takes even longer, in today's commercial SDRAM's, especially when one switches from Bank X to Bank Y. In this invention, since all banks are normally 'on', there is no such penalty. In other words, the minimum write latency is slightly longer than the minimum read latency. These bits therefore allow the read latency to be adjusted to optimize read/write timing. Specifically, the burst latency is the delay in the output of the first bit of a burst of data from the high to low transition of /CAS. The desired delay is generated using an internal clock optimized for DRAM operations with SRAM register operations.

In the illustrated embodiment, the bitfield consisting of bits 7–8 and the bitfield consisting of bits 14–16 are reserved for future use.

Bit 9 is used to select between single word bursting and bursting in bursts of the length specified in the burst length register. For example, if a zero is written into the bit 9 position, then the write burst length will be as defined by the burst length bits written into the bitfield 0–2. If a logic one is loaded into bit position 9, the write burst length will be one word. In other words, writes will be made on a word by word basis.

Bit 12 controls the data strobe. If a logic zero is written into bit position 12, an internal delay locked loop (DLL) clock generator is the selected source for the global data strobe (DS). In contrast, if a logic one is written to this bit position, external data strobe clock is selected over the internally generated clock. The external clock is an addition to the Synchronous System Clock, master clock or primary clock to device 600.

Data Strobe (DS), internal or external, can be (for example) timed off /CAS, for BOTH read and write operations; or for read only.

Bit position 13 holds a bit which defines the adjustment resolution of the read data latency. If a zero is written into bit position 13, then the data latency is programmed in integers of the system clock CLK (e.g., latencies of 1, 2, 3, . . . n CLK periods). If a logic one is written into bit position 13, data latency is set in 0.5 clock increments (e.g., latencies of 0.5, 2.5, 3.5 . . . CLK periods).

The bitfield consisting of bits 17–20 holds the bank status bits. Using these bits, the CPU (and corelogic) and operating system can selectively activate and deactivate banks 601.

Hence, the CPU is given the ability to repeatedly access a specified amount of memory. Further, by appropriately setting this register, predictive/speculative execution of instructions by the CPU can be implemented. The bit encoding for banks status bitfield is provided in Table 1.

TABLE I

| Bank Status Register Bits | | | | Bank Status | | | |
| --- | --- | --- | --- | --- | --- | --- | --- |
| 20 | 19 | 18 | 17 | $Bank_n$ | $Bank_{n+1}$ | $Bank_{n+2}$ | $Bank_{n+3}$ |
| 0 | 0 | 0 | 0 | A | D | D | D |
| 0 | 0 | 0 | 1 | D | A | D | D |
| 0 | 0 | 1 | 0 | D | D | A | D |
| 0 | 0 | 1 | 1 | D | D | D | A |
| 0 | 1 | 0 | 0 | A | A | D | D |
| 0 | 1 | 0 | 1 | D | A | A | D |
| 0 | 1 | 1 | 0 | D | D | A | A |
| 0 | 1 | 1 | 1 | A | D | D | A |
| 1 | 0 | 0 | 0 | A | D | A | D |
| 1 | 0 | 0 | 1 | D | A | A | D |
| 1 | 0 | 1 | 0 | D | A | D | A |
| 1 | 0 | 1 | 1 | A | A | A | D |
| 1 | 1 | 0 | 0 | D | A | A | A |
| 1 | 1 | 0 | 1 | A | D | A | A |
| 1 | 1 | 1 | 0 | A | A | D | A |
| 1 | 1 | 1 | 1 | A | A | A | A |

A = Active
D = Deactivated

The bitfield consisting of bit positions 21 and 22 is the SRAM output field. This field allows the CPU and operating system to selectively sequence through banks 601. The encoding for this field is provided in Table. II. In Table II, $Bank_n$ represents the bank which contains the target data, as identified by bit comparison circuitry using the procedure described above. From then on, depending on the bank status register bits, additional banks can be accessed in specified sequence.

TABLE II

| Register Bit 22 | Register Bit 21 | Bank Access Sequence |
| --- | --- | --- |
| 0 | 0 | $Bank_n \rightarrow Bank_{n+1} \rightarrow Bank_{n+2} \rightarrow Bank_{n+3}$ |
| 0 | 1 | $Bank_n \rightarrow Bank_{n+1} \rightarrow Bank_{n+2}$ |
| 1 | 0 | $Bank_n \rightarrow Bank_{n+1}$ |
| 1 | 1 | $Bank_n$ only |

Assume for discussion purposes that an 01 is written into SRAM output bitfield. Also assume that, from the row address, comparator 502 has identified Bank 2 (601b) as the bank initially containing desired data. For the case where each bank includes two SRAM registers 701, the first SRAM register 701a of bank 2 is accessed followed by the second SRAM register 701b for that bank. In response to the 01 programmed into the SRAM output field, the next bank accessed is bank Bn+1 (i.e., Bank3) is accessed, with SRAM register 1 and SRAM register 2 sequentially accessed from Bank1. The process repeats itself for Bankn+2 (i.e., Bank4) In this example, the loop of accesses from Banks 2, 3 and 4 can continue as long as the CPU needs to repeatedly access those locations. It should be recognized that the access could also be made from the bank DRAM cell arrays 402 for the given bank in addition to the SRAM registers.

If the looping option is chosen, the CPU and the operating system must be configured to recognize how data are stored and retrieved from the sequence of banks such that the proper data is accessed at the proper time.

Bit position 23 maintains a read/write selection bit. When a zero is set in bit position 23, a write is performed through the bank or banks identified in the SRAM output bitfield (bits 22–21). Similarly, when a logic one is set into bit position 23 a read operation is made from the identified bank or banks in accordance with the SRAM output bitfield.

Figure 9A:
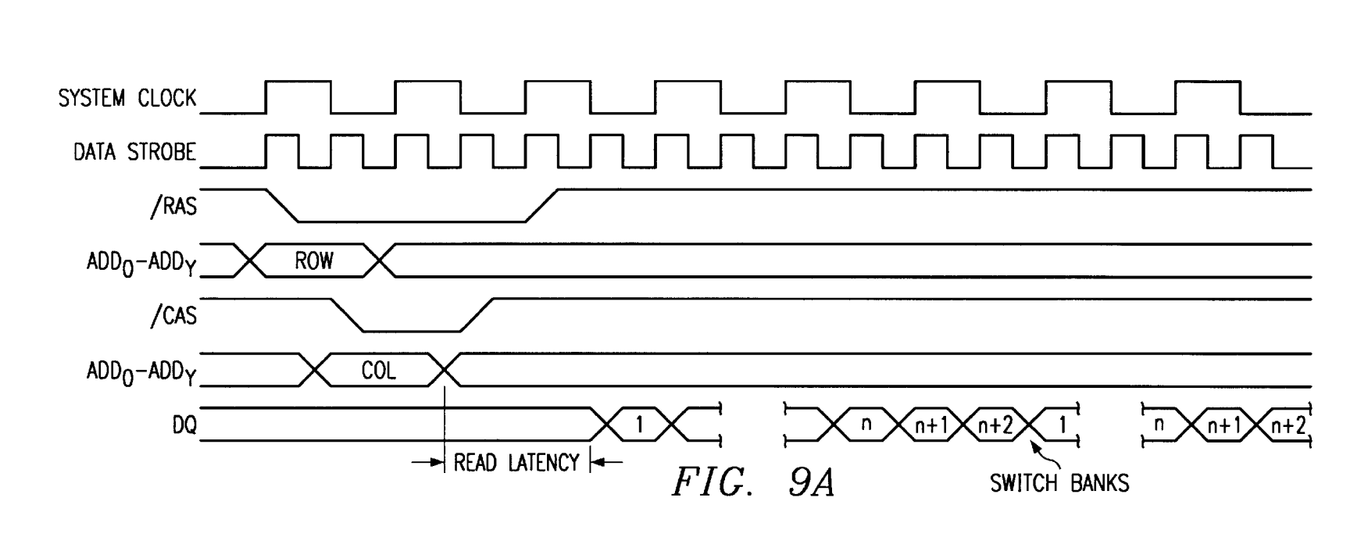
FIGS. 9A and 9B illustrate respective timing diagrams for exemplary read and write operations to the memory of FIG. 7.
Figure 9B:
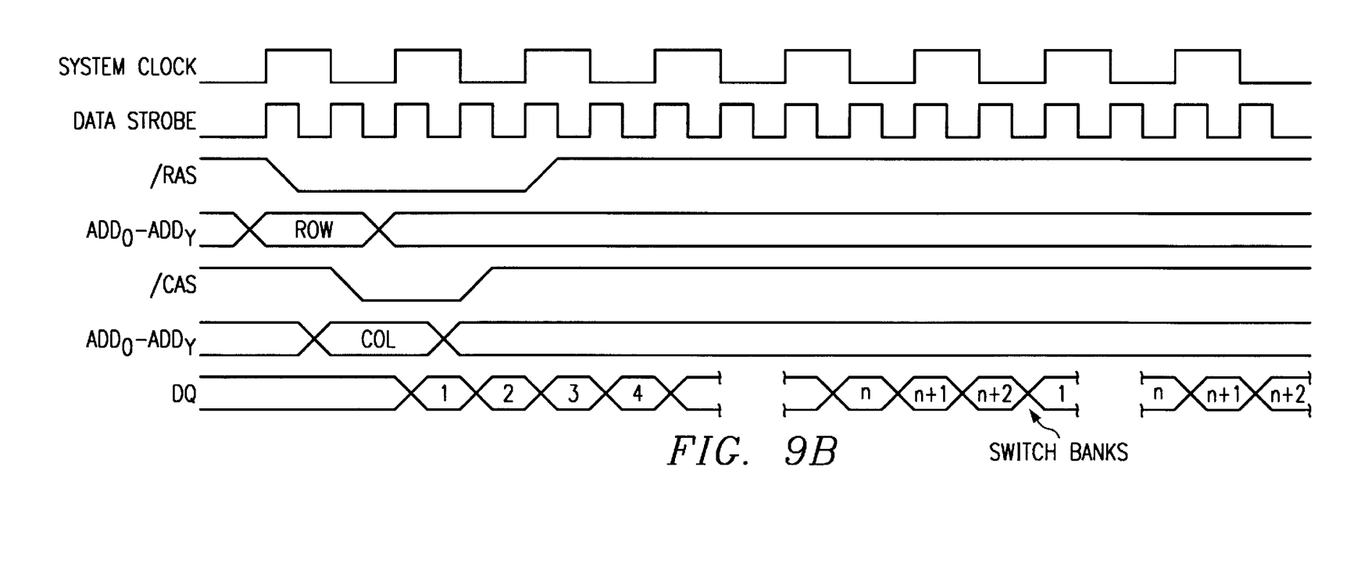

FIG. 9A and 9B are respective timing diagrams for the read and write operations according to the principles of the present invention.

As is shown in FIG. 9A, a read from device 600 is timed by the system clock (which in synchronous embodiments, comprises the master clock). The Data strobe (DS) clocks data out of the data latches 409 for the bank 601 being accessed. As indicated above, the data strobe can be generated either internal to device 600 or externally. In the embodiment shown in FIG. 9A, the data strobe is generated by doubling the frequency of the system clock. Tripling, quadrupling data rates can also be accomplished.

On the falling edge of /RAS, a row address is input through the data port $Add_o$–$Add_y$ and shortly thereafter becomes valid. The row address bits are then processed as discussed above using the global row assignor 406 and LRR address latch 502 and bit compare circuitry 503 of the selected bank.

On the falling edge of /CAS, an initial row address is input through the address port $Add_o$–$Add_y$. Shortly thereafter, the column address becomes valid. Data is then output through the data port (DQ), starting at the initial column address, after the programmed read latency (FIG. 8) express. Words of data are output through data latches 409 of the initial bank in response to the rising edges of the data strobe. If plurality of banks have been selected for the read access, a bank switch is made once the data is SRAM registers 701a and 701b of the initial bank have been paged out. The paging from the next bank in the loop starts from the initial address latched in the column address latches 504 with the column address strobe.

As is shown in FIG. 9B, a write access to device 600 is similar to a read access. Timing is again controlled by the system clock, /CAS, /RAS and /WE and the data strobe (DS). The strobes /RAS and /CAS also time the input and validation of the addresses. The most significant difference in the timing of the write operation is that there is a fixed latency between the latching of the column address and writing of the first bit of data. In other words, while the read latency can be adjusted using the Read Latency Field, no provision is required to adjust the write latency. Again, data are written by words starting at the location corresponding to the received column address from SRAM register 1 of the initial bank and continuing through the locations of SRAM register 2. At the conclusion of the write to SRAM register 2, the writes switch to register 1 of the next bank in the loop, starting with the location corresponding to the column address latched in that banks column address latch 504.

As discussed above, data can be loaded into the SRAM registers can be accessed in a number of different ways, include non-contiguous accessing within a bank, between banks, or both. For example, consider the case where Bank 0 registers 701a and 701b are respectively accessed with Addr0 and Addr4, the SRAM registers of Bank 1 with addresses Addr1 and Addr5, the SRAM registers of Bank 2 with addresses Addr2 and Addr6, and the Bank 3 data at addresses Addr3 and Addr7. This type of access can be implemented as follows.

During a first /RAS cycle. A row address is received at the address (DQ) port. On the falling edge of /RAS the row address MSBs are latched in the row address latches 501 of all the banks. The LSBs of the row address are again used by the global row assignor to enable comparison circuitry 503 of one selected bank being accessed. For that bank, comparison circuitry 503 compares the incoming row address MSBs with the LRR row address MSBs stored in each of the plurality of LRR latches 703 for the selected bank.

Assume that Bank 0 is the bank being accessed and that a match occurs between the incoming row address MSBs (Addr) and the bits stored in LRR latch 1. In response to /CAS and the incoming column addresses, SRAM register 1 of Bank 0 is accessed. For Bank 0, the address row address register is incremented to produce address Addr+4. This new address is used to access Bank 0 DRAM array 402 and load Bank 0 SRAM register 2 (701*b*). At the same time, the incoming address in row latch 501 of Bank 1 is incremented to Addr+5, in the Bank 2 row address latch to Addr+6 and in the Bank 3 row address latch to Addr+7. These modified addresses are used to transfer data between each bank's DRAM array of its SRAM register 2 (701*b*).

It should be noted that if the incoming row address MSBs instead matched with the bits in an LRR Latch 2 (703*b*) of Bank 0, then the Bank 0 SRAM register 2 (701*b*) is accessed and the contents of the row address registers are incremented in all banks to load SRAM registers 1 for all banks. In this example, the incoming row address latched in Bank 0 would be incremented to Addr−4, in Bank 1 to Addr−3, in Bank to Addr−2 and Bank 3 to Addr−1. SRAM registers 1 would the be loaded from DRAM in accordance to the modified addresses.

At the start of the second /RAS cycle, the contents of row address registers 501 for all banks are copied to the LRR latches corresponding to the set of SRAM registers which were loaded during the first /RAS cycle. For example, if SRAM registers 2 (701*b*) were loaded during the first cycle, the modified contents of row address latches are transferred to the associated LRR latches (703*b*).

In the second /RAS cycle, the second set of SRAM latches are loaded. Continuing with the example where the first /RAS cycle loaded SRAM registers 1, with Bank 0 being the accessed bank, the modified row address in the Bank 0 row address latch is decremented back to Addr, in Bank 1 to Addr+1, in Bank 2 to Addr+2, and Bank 3 to Addr+3. These twice-modified addresses are used to load SRAM registers 2 from DRAM and at the start of the following /RAS cycle are loaded into the corresponding LRR latches 2.

In the case where SRAM registers 2 where loaded during the first /RAS cycle, the addresses could be modified as follows for purposes of loading SRAM registers 1 during the second /RAS cycle. If Bank 0 is the accessed bank, the contents of its row address latches are decremented to the original input address Addr. Similarly the addresses in the Banks 1, 2 and 3 are respectively modified to become Addr+1, Addr+2 and Addr+3.

The procedure is the same no matter which bank is accessed through the DQ port (thereby determining the address modification sequence) and no matter how the row address MSBs are modified. In sum, numerous sequences and address modifications are possible, as required to access a predetermined block of data, with a given spacial and/or temporal coherency, in the SRAM registers.

When no match occurs between the received row address MSBs and any of the row addresses MSBs stored in SRAM registers 703 and the access bank selected by global row assignor 406, the accessing procedure changes. In this case, no SRAM registers 701 are accessed through the DQ port and all SRAM registers 701 (if desired) are loaded from DRAM.

During the first /RAS cycle, the received row address MSBs latched in and then used to transfer data from the DRAM array 402 of the bank being accessed to a selected one of the plurality of SRAM registers (arrays) 701. The choice of which SRAM register 701 to be loaded can be a function of anyone of a number of factors. For example, it may be the encoding of the address bits themselves (e.g. odd parity sends the data to one register and even parity to another register) or to obtain specific temporal locality (e.g. the register which has not be reloaded in the immediately previous cycle or cycles). At the same time, the received row address MSBs are modified in the address latches 501 of the remaining banks, as desired to define the first half of a block of data to be stored in SRAM. Preferably these registers correspond to the SRAM register selected in the accessed bank (i.e. if register 1 is loaded in the accessed bank, register 1 is loaded in the remaining bank). The SRAM registers 701 of these banks are subsequently loaded using the modified addresses.

At the start of the second /RAS cycle, the contents of the row address latches 501 are copied to the LRR latches 703 corresponding to the SRAM registers 701 accessed during the first /RAS cycle. Row address increment/decrement circuitry 702 then modifies the addresses in row address latches 501 as required to access the required block of data within DRAM and transfer that block of data into SRAM cache. The SRAM registers 701 not loaded during the first /RAS cycle are loaded during this cycle, in accordance with the new addresses stored in row address latches 501. At the start of the subsequent /RAS cycle, these addresses will be copied to the appropriate LRR latches 703, depending on the SRAM registers loaded.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory comprising:

a plurality of static random access memory cell arrays;

a plurality of sets of latches each for storing address bits associated with data stored in a corresponding one of said static random access cell arrays; and bit comparison circuitry for comparing a received address bit with an address bit stored in each of said plurality of sets of latches, and enabling access to a selected one of said static cell arrays corresponding to a said set of latches storing an address bit matching said received bits.

2. The memory of claim 1 and further comprising:

a dynamic random access memory cell array; and circuitry for selectively exchanging data between said dynamic random access array to a selected one of said static random access memory arrays.

3. The memory of claim 1 and further comprising column decoder circuitry including a plurality of column decoders, each said column decoder for accessing a corresponding one of said static random access cell arrays.

4. The memory of claim 1 wherein and further comprising:

a row address latch for storing said received address bits; and circuitry for modifying address bits stored in said address latch to produce second address bits.

5. The memory of claim 1 wherein said received address bits and said address bits stored in said latches comprise row address bits.

6. A method of accessing blocks of data in a memory having a plurality registers and a memory array, comprising the steps of:

receiving an address through an address port;

comparing the received address with addresses previously stored in each of a plurality of latches;

when a match occurs between the received address and a matching address stored in a one of the latches performing the substep of accessing a register corresponding to the latches storing the matching address through a data port;

when a match does not occur between the received address and an address stored in one of the latches, performing the substeps of:

exchanging data between a location in the memory array addressed by the received address and a selected one of the registers; and storing the received address in one of the latches corresponding to the selected register;

modifying the received address to generate a modified address;

exchanging data between a location in the memory array addressed by the modified address and a second selected one of the registers; and storing the modified address in of one of the latches corresponding to the second selected register.

7. The method of claim 6 wherein said step of accessing comprises a step of accessing a plurality of locations in the register in response to a plurality of column addresses.

8. The method of claim 6 wherein said step of accessing comprises a step of accessing a plurality of selected registers in serial.

9. The method of claim 8 wherein said step of accessing comprises a step of accessing a plurality of selected registers in serial.

10. The method of claim 6 and further performing the substep when a match does not occurs of accessing the selected location through the data port.

11. A memory comprising:

a plurality of banks each comprising:

first and second arrays of static random access memory cells;

a first latch for storing a plurality of address bits accessing associated data stored in said first array;

a second latch for storing a plurality of address bits accessing associated data stored in said second array;

address compare circuitry for comparing first selected bits of a received address with address bits stored in said first and second latches and selectively enabling access of said first and second arrays in response;

a row address latch for storing a received address;

increment and decrement circuitry for selectively modifying an address stored in said address latch; and a global row assignor for selecting a said bank for access in response to second selected bits of said received address.

12. The memory of claim 11 and further comprising a mode control register for storing mode control for storing information for configuring said memory.

13. The memory of claim 12 wherein said mode control register includes a field for storing bits selectively activating and deactivating selected ones of said banks.

14. The memory of claim 12 wherein said mode control register includes a field for storing bits defining a sequence for accessing said plurality of banks.

15. The memory of claim 14 wherein said mode control register includes a field for storing a read/write selection bit.

16. The memory of claim 14 wherein each of said banks further comprises an array of rows and columns of dynamic random access memory cells.

17. The memory of claim 16 wherein each of said banks further includes:

a first column address decoder for accessing a column of cells in said first static cell array;

a second column decoder for accessing a column of cells in said second static array; and a third column decoder for accessing a column of cells in said dynamic cell array.

18. The memory of claim 17 wherein each of said banks further comprising a data latch coupled to said column decoders of said bank, said data latch exchanging data with said bank in response to a global data strobe.

19. The memory of claim 16 and further comprising circuitry for selectively exchanging data between said dynamic cell array and a selected one of said first and second cell arrays.

20. A method of operating a memory having a plurality of banks, each bank including a dynamic random access memory cell array and first and second static random access memory cell arrays, the method comprising the steps of:

receiving a row address;

decoding a bit of the row address to select a first bank for access;

comparing a selected bits of the received row address with bits stored in first and second latches in the first bank, the first latch holding an address associated with data stored in the first static array and the second latch holding an address associated with data stored in the second static array of the first bank;

when a match occurs between the selected bits of the received row address and the bits stored in the first latch, performing the substeps of:

accessing the first static array of the first bank;

modifying the received row address to generate a second row address; and in a second bank, loading a selected one of the first and second static arrays with data from the dynamic array using the second row address; and when a match does not occur between the selected bits of the received row address and the bits stored in the first and second latches of the first bank, performing the substeps of:

in the first bank, loading a selected one of the first and second static arrays with data from the dynamic array using the received row address;

modifying the received row address to generate a second row address; and in the second bank, loading a selected one of the first and second static arrays with data from the dynamic array using the second row address.

21. The method of claim 20 wherein said step of performing substeps when a match occurs further includes the substep of storing the modified address in the latch in the second bank associated with the selected static array.

22. The method of claim 20 wherein said step of performing substeps when a match does not occur further comprises the substep of storing the received address in the latch in the first bank associated with the selected static array in the first bank.

23. The method of claim 20 wherein said step of performing substeps when a match does not occur further comprises the substep of storing the modified address in the latch in the second bank associated with the selected static array in the second bank.

24. The method of claim 20 wherein said step of performing substeps when a match occurs comprises the substeps of:

generating a third row address;

loading in the second static array in the first bank using the third row address; and storing the third address in the second latch of the first bank.

25. The method of claim 24 wherein said step of performing substeps when a match occurs further comprises the steps of:

generating a fourth row address;

loading a second selected one of the first and second static arrays of the second bank using the fourth row address; and storing the fourth address in the latch associated with the selected static array.

26. The method of claim 20 wherein said step of performing substeps when a match does not occur further comprises the substeps of:

generating a third row address;

loading a second selected one of the first and second static arrays of the first bank; and storing the third row address in the latch associated with the second selected on of the arrays.

27. The method of claim 26 wherein said step of performing subsets when a match does not occur further comprises the substeps of:

generating a fourth row address;

loading a second one of the first and second static arrays of the second bank using the fourth row address.

* * * * *